(12) United States Patent
Takahashi et al.

(10) Patent No.: US 12,128,449 B2
(45) Date of Patent: Oct. 29, 2024

(54) SUBSTRATE CLEANING DEVICE, SUBSTRATE PROCESSING APPARATUS, BREAK-IN DEVICE, METHOD FOR ESTIMATING NUMBER OF FINE PARTICLES ADHERING TO SUBSTRATE, METHOD FOR DETERMINING DEGREE OF CONTAMINATION OF SUBSTRATE CLEANING MEMBER, AND METHOD FOR DETERMINING BREAK-IN PROCESSING

(71) Applicant: EBARA CORPORATION, Tokyo (JP)

(72) Inventors: Hiroki Takahashi, Tokyo (JP); Daichi Kondo, Tokyo (JP); Yu Imamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/839,382

(22) Filed: Jun. 13, 2022

(65) Prior Publication Data
US 2022/0395874 A1    Dec. 15, 2022

(30) Foreign Application Priority Data
Jun. 15, 2021    (JP) .................................. 2021-099288

(51) Int. Cl.
*B08B 13/00* (2006.01)
*B08B 3/02* (2006.01)
*B24B 29/02* (2006.01)

(52) U.S. Cl.
CPC .............. *B08B 13/00* (2013.01); *B08B 3/02* (2013.01); *B24B 29/02* (2013.01)

(58) Field of Classification Search
None
See application file for complete search history.

(56) References Cited

U.S. PATENT DOCUMENTS 5,860,181 A    1/1999    Maekawa et al.
2012/0284936 A1*  11/2012  Liu ................... H01L 21/67051
15/4
(Continued)

FOREIGN PATENT DOCUMENTS

CN        102779726 A  *  11/2012  .............. B08B 1/00
JP        H01-136339 A     5/1989
(Continued)

OTHER PUBLICATIONS

Translation of WO2008029884A1 (Year: 2023).*
Translation of CN 102779726 (Year: 2023).*

*Primary Examiner* — Eric W Golightly
(74) *Attorney, Agent, or Firm* — BakerHostetler

(57) ABSTRACT

According to one embodiment of the present disclosure, provided is a substrate cleaning device including: a substrate holder configured to hold a substrate; a substrate cleaning member configured to come into sliding contact with the held substrate, and clean the substrate using a first cleaning liquid supplied from a first nozzle; a self-cleaning member configured to come into sliding contact with the substrate cleaning member at a retreat position separated from the substrate holder, and performs self-cleaning on the substrate cleaning member using a second cleaning liquid supplied from a second nozzle; a measurement module configured to measure a physical property value of a waste liquid of the second cleaning liquid used for the self-cleaning of the substrate cleaning member; and a controller configured to estimate a number of fine particles adhering to the cleaned substrate based on the physical property value of the waste liquid.

6 Claims, 10 Drawing Sheets

(56) References Cited

U.S. PATENT DOCUMENTS

| | | |
|---|---|---|
| 2013/0220368 A1 | 8/2013 | Ishibashi |
| 2016/0254170 A1* | 9/2016 | Hu .................... H01L 21/67046 134/1.3 |
| 2018/0337102 A1 | 11/2018 | Withers et al. |
| 2021/0039142 A1 | 2/2021 | Takatoh et al. |

FOREIGN PATENT DOCUMENTS

| | | | |
|---|---|---|---|
| JP | H05-003186 A | 1/1993 | |
| JP | H10-163143 A | 6/1998 | |
| JP | 2003-243350 A | 8/2003 | |
| JP | 3447869 B2 | 9/2003 | |
| JP | 5866227 B2 | 2/2016 | |
| JP | 2019-161107 A | 9/2019 | |
| JP | 2020-522126 A | 7/2020 | |
| WO | WO-2008029884 A1 * | 3/2008 | ......... G03F 7/70341 |

* cited by examiner

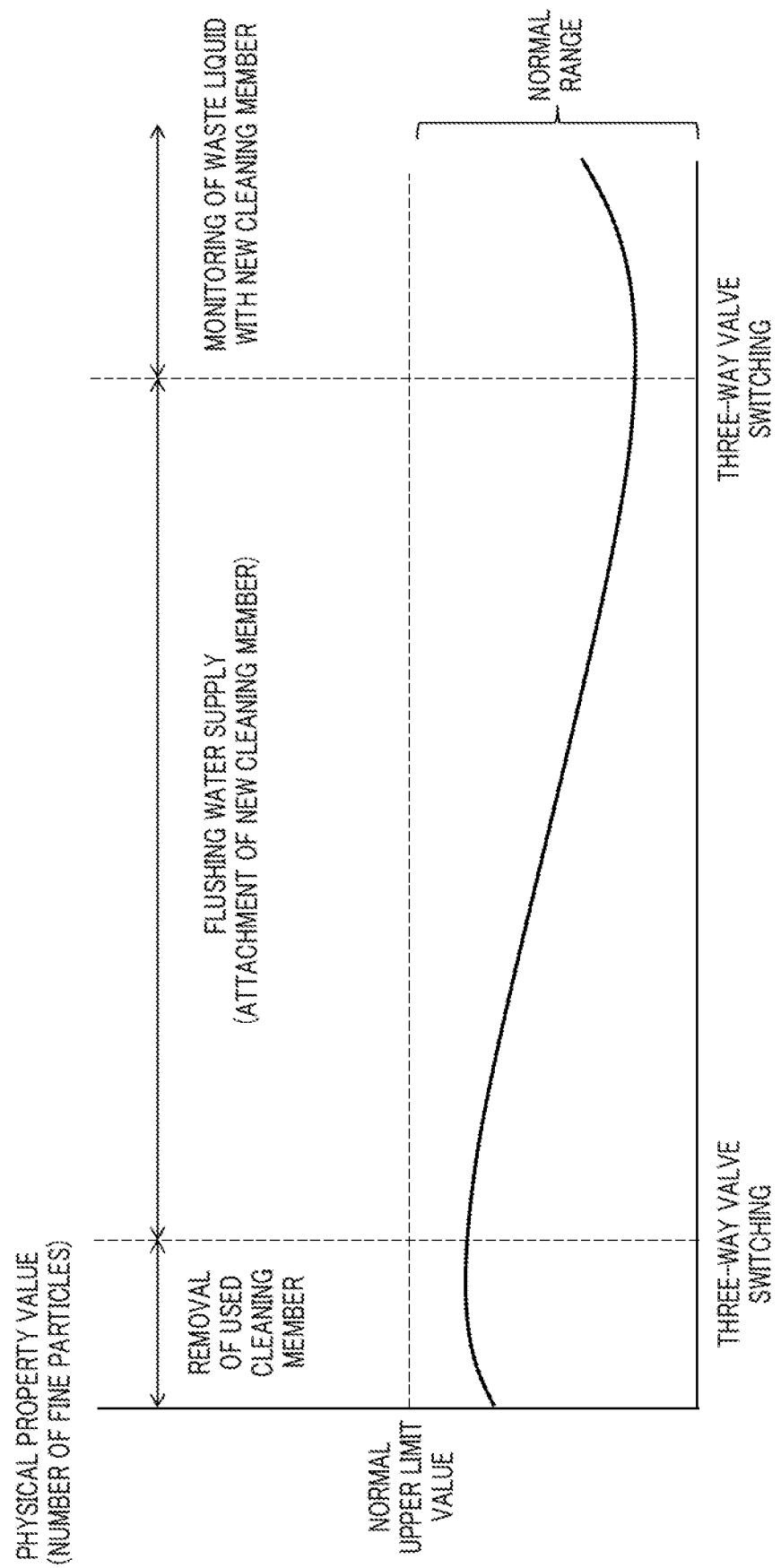

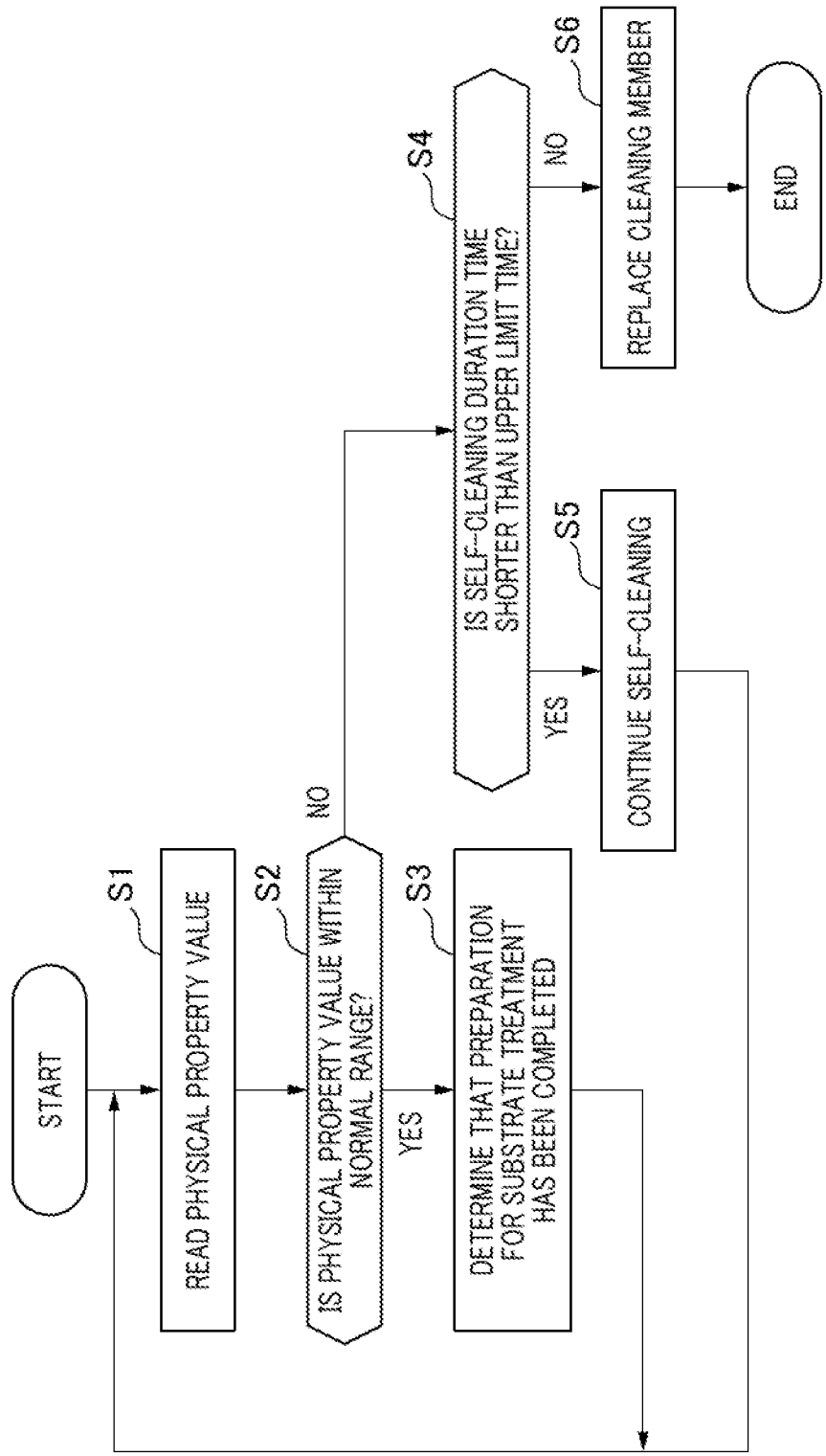

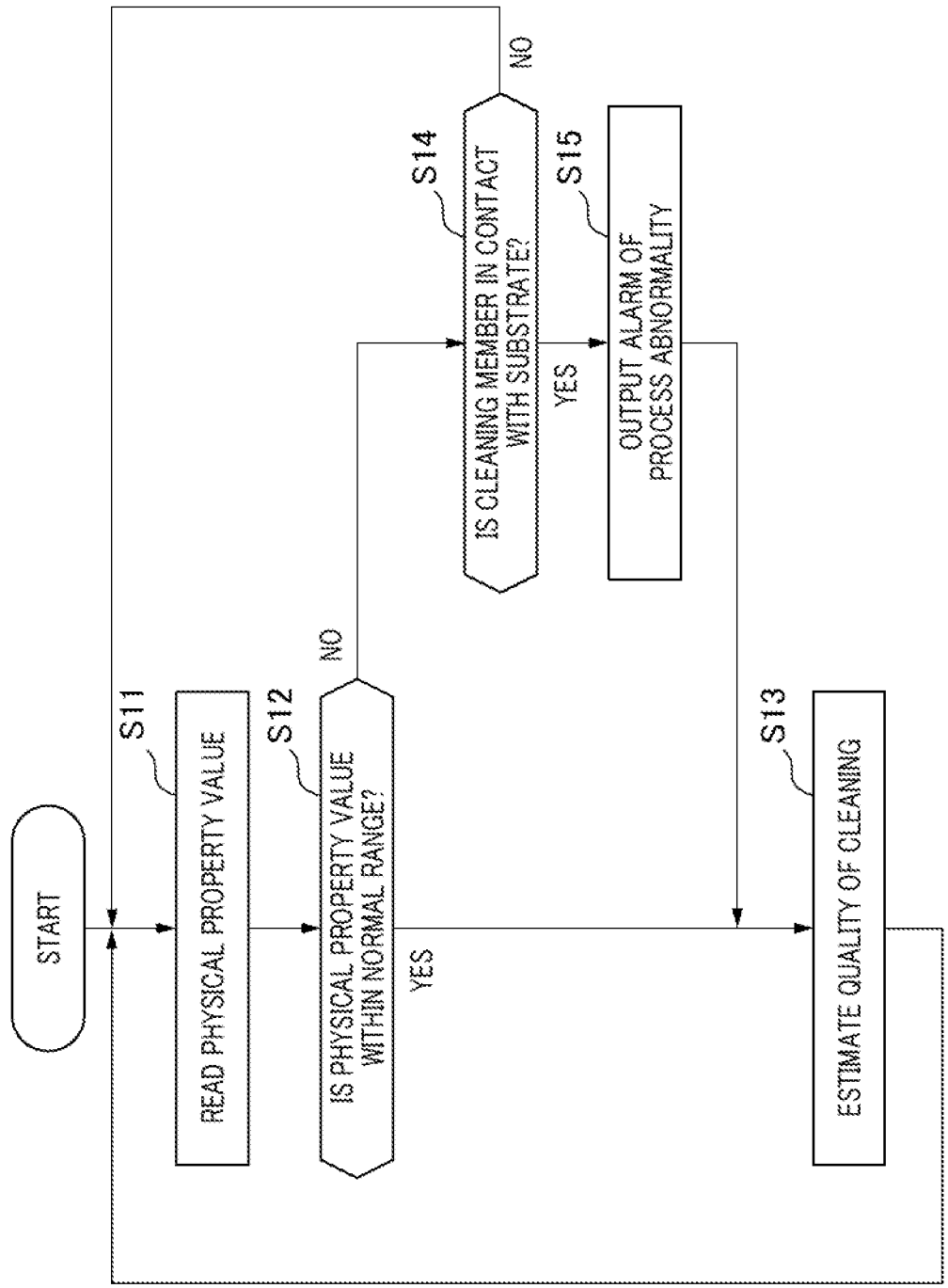

SUBSTRATE CLEANING DEVICE, SUBSTRATE PROCESSING APPARATUS, BREAK-IN DEVICE, METHOD FOR ESTIMATING NUMBER OF FINE PARTICLES ADHERING TO SUBSTRATE, METHOD FOR DETERMINING DEGREE OF CONTAMINATION OF SUBSTRATE CLEANING MEMBER, AND METHOD FOR DETERMINING BREAK-IN PROCESSING

CROSS-REFERENCE TO RELATED APPLICATIONS

This application claims the benefit of Japanese Priority Patent Application JP 2021-099288 filed on Jun. 15, 2021, the entire contents of which are incorporated herein by reference.

FIELD

The present disclosure relates to a substrate cleaning device, a substrate processing apparatus, a break-in device of cleaning member (sponge brush), a method for estimating the number of fine particles adhering to a substrate, a method for determining the degree of contamination of a substrate cleaning member, and a method for determining break-in processing.

BACKGROUND AND SUMMARY

JP 2019-161107 A discloses a substrate processing apparatus that sequentially performs a polishing treatment, a cleaning treatment, and a drying treatment on a substrate. In the polishing treatment, the surfaces of the substrate are polished with a suspension (slurry) that contains abrasive grains and an auxiliary polishing agent. In the cleaning treatment after that, the slurry that has adhered to the front surface and the back surface of the substrate during the polishing treatment is removed with a cleaning member. In the drying treatment after that, droplets that have adhered to the front surface and the back surface of the substrate during the cleaning treatment are removed.

In a case where the cleaning treatment is not appropriate, a defect might occur in the structure of an element formed on the substrate, and the defect might cause a characteristic failure of the element. Therefore, it is necessary to select a cleaning treatment method for reliably removing the slurry quickly without causing breakage or corrosion of the element. In view of such a background, scrub-cleaning using a cleaning member formed with PVA sponge is adopted in the cleaning treatment, and various kinds of cleaning liquids are also used in an auxiliary manner (JP 5866227 B1, for example).

In the scrub-cleaning, the cleaning member is brought into contact with the substrate. Therefore, the cleanliness of the cleaning member affects the level of the cleaning effect. That is, if the cleaning member is clean, the substrate can be appropriately cleaned. However, when contamination of the cleaning member worsens, contaminants are removed from the substrate, but there is a possibility that the contaminants deposited on the cleaning member will re-adhere to the substrate (cross contamination), and any cleaning effect will not be obtained.

As one of the means to prevent this cross contamination, there is a known technique called self-cleaning for cleaning a cleaning member at certain intervals or every time a certain number of substrates have been treated (JP 3447869 B1, for example). Also, a brand-new cleaning member is subjected to break-in processing (the conditioning before the start of use of the brand-new cleaning member).

According to one embodiment of the present disclosure, provided is a substrate cleaning device comprising: a substrate holder configured to hold a substrate; a substrate cleaning member configured to come into sliding contact with the held substrate, and clean the substrate using a first cleaning liquid supplied from a first nozzle; a self-cleaning member configured to come into sliding contact with the substrate cleaning member at a retreat position separated from the substrate holder, and performs self-cleaning on the substrate cleaning member using a second cleaning liquid supplied from a second nozzle; a measurement module configured to measure a physical property value of a waste liquid of the second cleaning liquid used for the self-cleaning of the substrate cleaning member; and a controller configured to estimate a number of fine particles adhering to the cleaned substrate based on the physical property value of the waste liquid.

The physical property value may include at least one of a number of fine particles, a pH value, an electrical conductivity, and a total organic carbon concentration.

According to one embodiment of the present disclosure, provided is a substrate cleaning device comprising: a substrate holder configured to hold a substrate; a substrate cleaning member configured to come into sliding contact with the held substrate, and cleans the substrate using a first cleaning liquid supplied from a first nozzle; a self-cleaning member configured to come into sliding contact with the substrate cleaning member at a retreat position separated from the substrate holder, and performs self-cleaning on the substrate cleaning member using a second cleaning liquid supplied from a second nozzle; a measurement module configured to measure a physical property value of a waste liquid of the second cleaning liquid used for the self-cleaning of the substrate cleaning member; and a controller configured to determine a degree of contamination of the substrate cleaning member based on the physical property value of the waste liquid, wherein the physical property value includes a total organic carbon concentration.

The controller may estimate a number of fine particles adhering to the cleaned substrate, on a basis of the physical property value of the waste liquid.

The controller may determine an operating condition for self-cleaning based on the physical property value of the waste liquid.

The controller may determine an operating condition for substrate cleaning based on the physical property value of the waste liquid.

The controller may determine a timing to replace the substrate cleaning member based on the physical property value of the waste liquid.

The substrate cleaning device may further comprise: a first pipe configured to guide the waste liquid of the second cleaning liquid used for the self-cleaning of the substrate cleaning member to the measurement module; a three-way valve provided in the first pipe; and a second pipe configured to supply flushing water to the measurement module via the three-way valve.

According to one embodiment of the present disclosure, provided is a substrate processing apparatus comprising: a substrate polishing device that polishes a substrate, using a suspension; and the substrate cleaning device.

According to one embodiment of the present disclosure, provided is a break-in device comprising: a self-cleaning member configured to come into sliding contact with a substrate cleaning member before substrate cleaning, and perform break-in processing on the substrate cleaning member using a cleaning liquid supplied from a nozzle; a measurement module configured to measure a physical property value of a waste liquid of the cleaning liquid used for the break-in processing; and a controller configured to determine whether the break-in processing is appropriate based on the physical property value of the waste liquid.

According to one embodiment of the present disclosure, provided is a method for estimating a number of fine particles adhering to a substrate, the method comprising: holding the substrate with a substrate holder; bringing a substrate cleaning member into sliding contact with the held substrate, and cleaning the substrate using a first cleaning liquid supplied from a first nozzle; bringing a self-cleaning member into sliding contact with the substrate cleaning member at a retreat position separated from the substrate holder, and performing self-cleaning on the substrate cleaning member using a second cleaning liquid supplied from a second nozzle; measuring a physical property value of a waste liquid of the second cleaning liquid used for the self-cleaning of the substrate cleaning member; and estimating the number of fine particles adhering to the cleaned substrate based on the physical property value of the waste liquid.

According to one embodiment of the present disclosure, provided is a method for determining a degree of contamination of a substrate cleaning member, the method comprising: holding a substrate with a substrate holder; bringing the substrate cleaning member into sliding contact with the held substrate, and cleaning the substrate using a first cleaning liquid supplied from a first nozzle; bringing a self-cleaning member into sliding contact with the substrate cleaning member at a retreat position separated from the substrate holder, and performing self-cleaning on the substrate cleaning member using a second cleaning liquid supplied from a second nozzle; measuring a total organic carbon concentration of a waste liquid of the second cleaning liquid used for the self-cleaning of the substrate cleaning member; and determining the degree of contamination of the substrate cleaning member based on the total organic carbon concentration of the waste liquid.

According to one embodiment of the present disclosure, provided is a method for determining break-in processing, the method comprising: bringing a self-cleaning member into sliding contact with a substrate cleaning member before substrate cleaning, and performing break-in processing on the substrate cleaning member using a cleaning liquid supplied from a nozzle; measuring a physical property value of a waste liquid of the cleaning liquid used for the break-in processing; and determining whether the break-in processing is appropriate based on the physical property value of the waste liquid.

The degree of contamination of the cleaning member can be monitored. The number of fine particles adhering to the substrate can also be estimated.

BRIEF DESCRIPTION OF DRAWINGS

FIG. 5A is a graph schematically showing outputs of physical property values measured by the self-cleaning waste liquid sensor;

FIG. 6 is a flowchart showing an example of a processing operation to be performed by a controller;

FIG. 7 is a flowchart showing another example of a processing operation to be performed by the controller;

DETAILED DESCRIPTION

The following is a detailed description of embodiments according to the present disclosure, with reference to the accompanying drawings.

Figure 1:
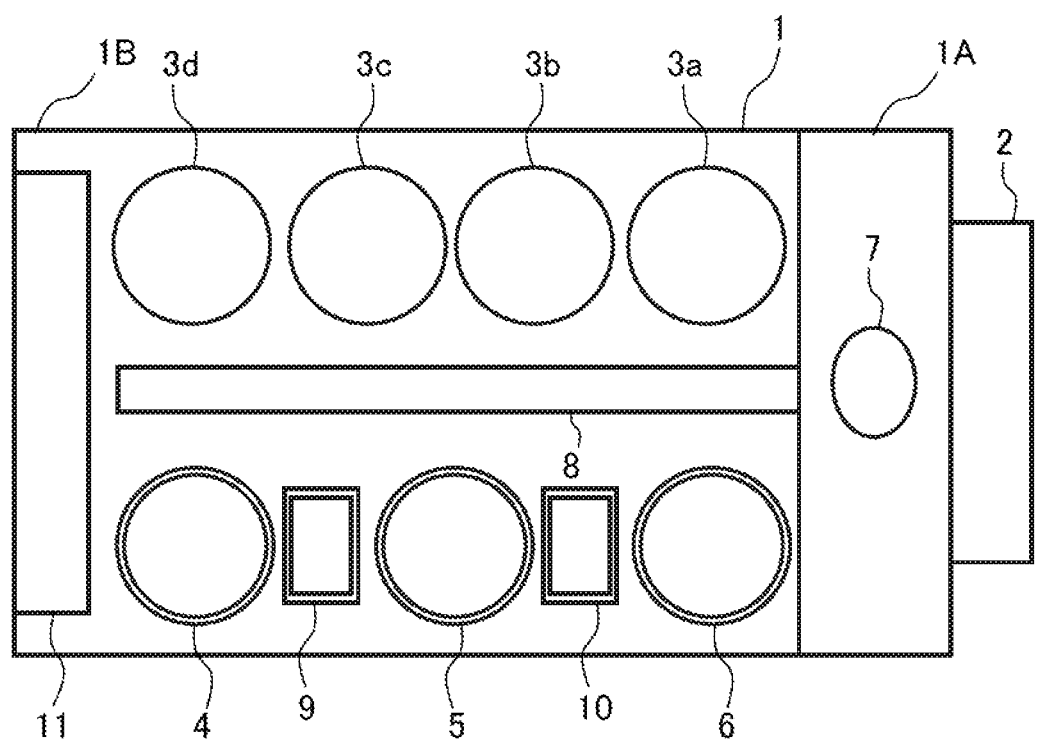
FIG. 1 is a plan view showing the entire configuration of a substrate processing apparatus that includes substrate cleaning devices according to an embodiment.

FIG. 1 is a plan view showing the entire configuration of a substrate processing apparatus that includes substrate cleaning devices according to an embodiment. This substrate processing apparatus processes substrates such as semiconductor substrates, and can be used in the process of manufacturing memory elements, logic elements, image sensors such as CMOSs or CCDs, or flat panel displays.

The substrate processing apparatus includes a rectangular housing 1 and a load port 2 on which a substrate cassette is placed, and the load port 2 is disposed adjacent to the housing 1. The substrate processing apparatus also includes polishing units 3a to 3d (substrate polishing devices) provided inside the housing 1, a first cleaning unit 4 (a substrate cleaning device), a second cleaning unit 5 (a substrate cleaning device), a drying unit 6, and a controller 11 that controls movements of each unit and each device.

The housing 1 is divided into a region 1A close to the load port 2, and a region 1B in which the polishing units 3a to 3d, the first cleaning unit 4, the second cleaning unit 5, and the drying unit 6 are disposed.

The polishing units 3a to 3d polish and planarize the principal surface of a substrate. The polishing units 3a to 3d polish the principal surface of substrate, using a suspension (slurry) containing abrasive grains and an auxiliary polishing agent. Therefore, the suspension and polishing waste adhere as contaminants to the front surface and the back surface of the substrate after the polishing.

The first cleaning unit 4 performs primary cleaning on a polished substrate, and the second cleaning unit 5 performs finish-cleaning on the substrate after the primary cleaning. Specifically, the first cleaning unit 4 and the second cleaning unit 5 scrub-cleans a substrate using a substrate cleaning member while supplying a cleaning liquid to the substrate, to remove the contaminants adhering to the substrate during the polishing treatment.

The drying unit 6 dries the substrate after the finish-cleaning. Specifically, the drying unit 6 removes droplets of the cleaning liquid adhering to the substrate during the cleaning treatment.

In the housing 1, the polishing units 3a to 3d are aligned in the longitudinal direction of the substrate processing apparatus. The first cleaning unit 4, the second cleaning unit 5, and the drying unit 6 are also aligned in the longitudinal direction of the substrate processing apparatus.

A first substrate conveying robot 7 is disposed in the region 1B surrounded by the load port 2, the polishing unit 3a, and the drying unit 6. A substrate conveying unit 8 extending parallel to the alignment of the polishing units 3a to 3d is also provided. A second substrate conveying robot 9 is disposed between the first cleaning unit 4 and the second cleaning unit 5. Further, a third substrate conveying robot 10 is disposed between the second cleaning unit 5 and the drying unit 6.

The first substrate conveying robot 7 receives a substrate yet to be polished from the load port 2, and transfers the substrate to the substrate conveying unit 8. The first substrate conveying robot 7 further receives a dried substrate from the drying unit 6, and returns the dried substrate to the load port 2.

The substrate conveying unit 8 conveys substrates received from the first substrate conveying robot 7, and transfers and receives substrates to and from the polishing units 3a to 3d. That is, the substrate conveying unit 8 receives polished substrates from the polishing units 3a to 3d.

The second substrate conveying robot 9 receives a polished substrate from the substrate conveying unit 8, and transfers the substrate to the first cleaning unit 4. The second substrate conveying robot 9 receives a substrate subjected to the primary cleaning from the first cleaning unit 4, and transfers the substrate to the second cleaning unit 5.

The third substrate conveying robot 10 receives a substrate subjected to the finish-cleaning from the second cleaning unit 5, and transfers the substrate to the drying unit 6.

Figure 2:
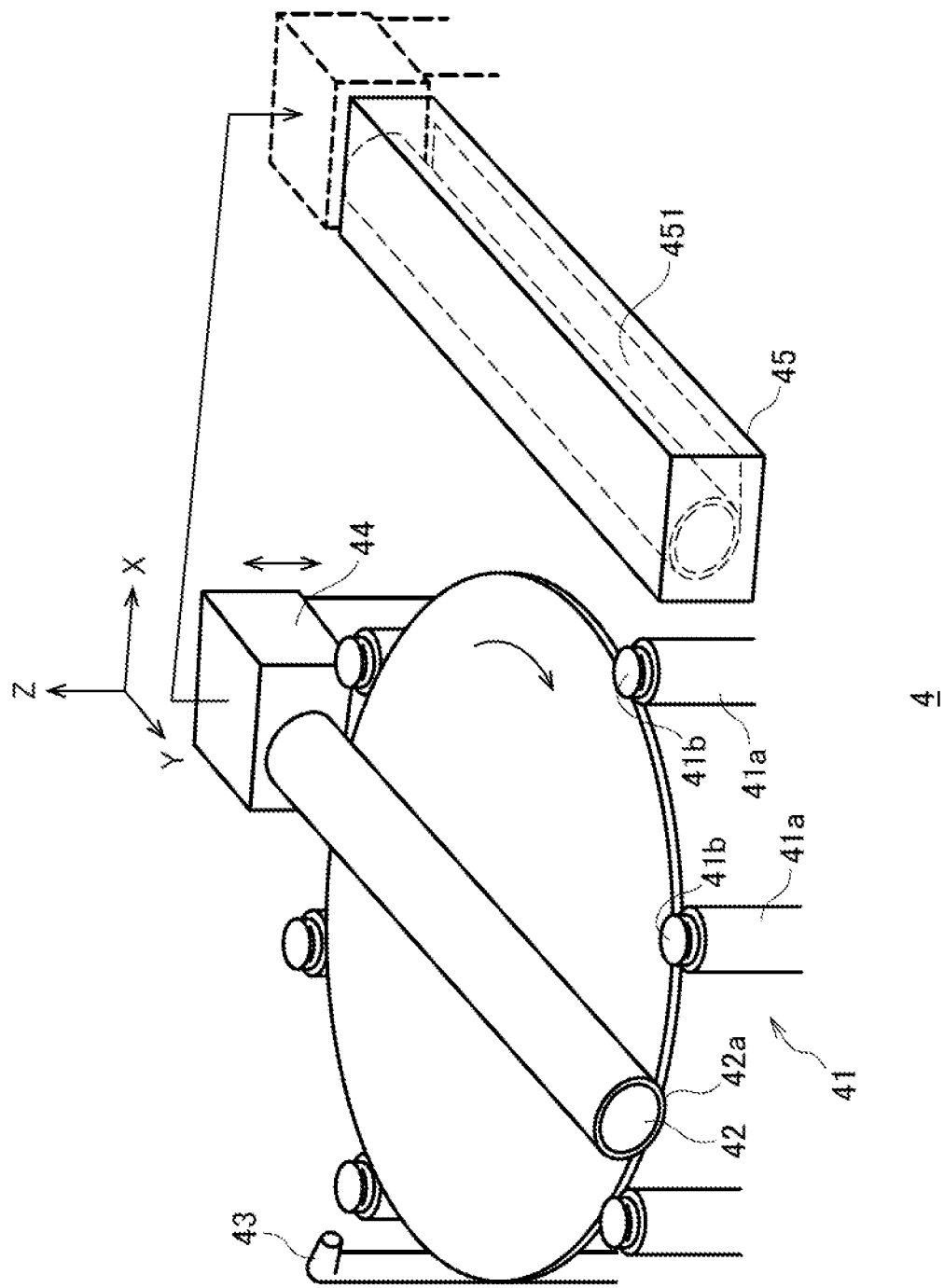
FIG. 2 is a perspective diagram showing an entire first cleaning unit.

FIG. 2 is a perspective diagram showing the entire first cleaning unit 4. The first cleaning unit 4 includes a spin chuck 41 (a substrate holder), a cleaning roller 42, a cleaning liquid nozzle 43, a support column 44, and a self-cleaning module 45.

The spin chuck 41 horizontally holds and rotates a substrate W so that its principal surface faces upward (or turns out to be the upper surface). Specifically, the spin chuck 41 includes fixed spindles 41a, and tops 41b that are rotatably provided on the respective spindles 41a and hold the outer peripheral portion of the substrate W. The rotative force of the tops 41b is transmitted to the outer periphery of the substrate W, and the substrate W rotates in a horizontal plane.

The cleaning roller 42 has a cylindrical shape, and rotates about an axis parallel to the surface of the substrate W. A roll-type cleaning member 42a (a substrate cleaning member) is wound around the cleaning roller 42. The material of the cleaning member 42a is PVA sponge or the like. Other than that, the material of the cleaning member 42a may be polyurethane sponge, silicone rubber sponge, or the like, but a highly hydrophilic resin is desirable. Although FIG. 2 shows one cleaning roller 42 in contact with the upper surface of the substrate W, the first cleaning unit 4 may further include an additional cleaning roller in contact with the lower surface of the substrate W.

The cleaning liquid nozzle 43 supplies a cleaning liquid to the upper surface of the substrate W held by the spin chuck 41. The cleaning liquid is a chemical liquid or pure water, for example. Although FIG. 2 shows one cleaning liquid nozzle 43 that supplies the cleaning liquid to the upper surface of the substrate W, the first cleaning unit 4 may further include an additional cleaning liquid nozzle that supplies the cleaning liquid to the lower surface of the substrate W. Also, the number of cleaning liquid nozzles 43 that supply the cleaning liquid to the upper surface may be two or more. In that case, one can be used for a chemical solution, and the other can be used for pure water.

The support column 44 supports the cleaning roller 42, and moves the cleaning roller 42 in the X direction (a direction orthogonal to the longitudinal direction of the cleaning roller 42) and the Z direction (the vertical direction) in the drawing. As the support column 44 moves in the X direction, the cleaning roller 42 moves between the position (the cleaning position) at which the spin chuck 41 is provided and the position (the retreat position) at which the self-cleaning module 45 is provided. Also, as the support column 44 moves in the Z direction at the cleaning position, the cleaning roller 42 comes into contact with or separates from the substrate W. Further, as the support column 44 moves in the Z direction at the retreat position, the cleaning roller 42 comes into contact with or separates from a quartz plate 451 (described later) of the self-cleaning module 45.

The self-cleaning module 45 performs self-cleaning on the cleaning member 42a at the retreat position separated from the spin chuck 41. The self-cleaning module 45 will be described later in detail with reference to FIG. 3.

The first cleaning unit 4 having such a configuration operates as follows, under the control of the controller 11. Before the substrate cleaning is performed, the cleaning roller 42 stands by at the retreat position.

First, the substrate W subjected to the polishing treatment by one of the polishing units 3a to 3d in FIG. 1 is conveyed onto the spin chuck 41 by the second substrate conveying robot 9. Contaminants adhere to the substrate W. The substrate W conveyed onto the spin chuck 41 is rotated by the tops 41b of the spin chuck 41, and the cleaning liquid is supplied from the cleaning liquid nozzle 43 toward the vicinity of the center of the substrate W. The cleaning roller 42 then moves from the self-cleaning module 45 (the retreat position) to the upper portion (the cleaning position) of the substrate W through an operation of the support column 44, and descends while rotating.

Scrub-cleaning is started when the cleaning member 42a relatively moves while being in sliding contact with the upper surface of the substrate W. By this scrub-cleaning, the contaminants adhering to the upper surface of the substrate are removed. Part of the contaminants removed from the upper surface of the substrate W remains on the cleaning member 42a. Also, the cleaning liquid contaminated when used for cleaning the substrate might remain on the cleaning member 42a as a contaminant. After a predetermined time has passed, the support column 44 moves upward, and the cleaning member 42a is separated from the substrate W. The scrub-cleaning then comes to an end.

After the cleaning of one substrate is completed, the cleaning roller 42 moves from above the substrate W to the self-cleaning module 45 through an operation of the support column 44. The self-cleaning module 45 then performs self-cleaning on the cleaning member 42a, to remove the contaminants remaining on the cleaning member 42a.

Although the first cleaning unit 4 holds the substrate W in the horizontal direction and rotates the substrate W, the self-cleaning module 45 is only required to be disposed at the retreat position separated from the substrate holder, and the form of the substrate holder is not necessarily a horizontal form but may be a vertical form.

Figure 3:
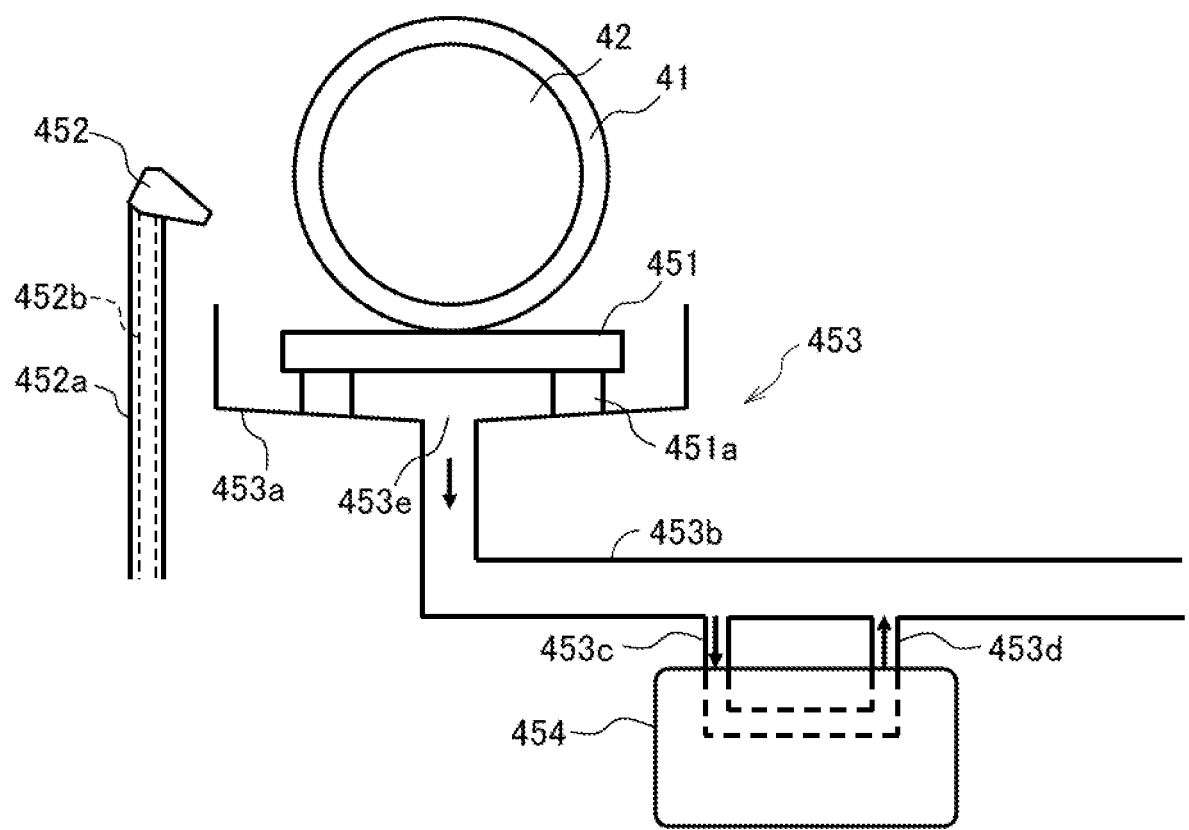
FIG. 3 is a schematic diagram showing the configuration of a self-cleaning module in the first cleaning unit.

FIG. 3 is a schematic diagram showing the configuration of the self-cleaning module 45 in the first cleaning unit 4.

The self-cleaning module 45 includes the quartz plate 451 (a self-cleaning member) supported by a pedestal 451a, and a self-cleaning liquid nozzle 452 that supplies a cleaning liquid (a chemical liquid or pure water, for example) to the upper surface of the quartz plate 451.

The self-cleaning member may be a resin plate formed with polytetrafluoroethylene (PTFE), polyvinylidene difluoride (PVDF), polyethylene terephthalate (PET), polymethyl methacrylate (PMMA), polycarbonate (PC), or the like, instead of a quartz plate. However, it is desirable to use a material that has such hardness as to make the surface less likely to be scratched, resistance to deformation, and chemical stability (with no possibility of elution of metal or organic substance, and little likelihood of thermal degradation).

The self-cleaning liquid nozzle 452 includes a cylindrical nozzle support 452a, and a conduit 452b buried inside the nozzle support 452a. Example types of the self-cleaning liquid nozzle 452 include a single-tube nozzle, a line nozzle, a conical nozzle, and a bar nozzle.

As described above, when the cleaning of one substrate is completed, the cleaning roller 42 is moved to the self-cleaning module 45. The cleaning roller 42 then descends while rotating through an operation of the support column 44 (FIG. 2). As the cleaning member 42a comes into sliding contact with the upper surface of the quartz plate 451, self-cleaning of the cleaning member 42a is performed with the cleaning liquid from the self-cleaning liquid nozzle 452. By this self-cleaning, the contaminants remaining on the cleaning member 42a are removed, and are discharged together with the cleaning liquid. After a predetermined time has passed, the support column 44 moves upward, and the cleaning member 42a is separated from the quartz plate 451. The self-cleaning then comes to an end. After the substrate cleaning is completed, a self-cleaning treatment may be started while the cleaning member 42a remains wet.

The self-cleaning module 45 also includes a self-cleaning liquid discharge pipe 453 and a self-cleaning waste liquid sensor 454.

The self-cleaning liquid discharge pipe 453 is disposed under the quartz plate 451, and discharges the waste liquid (the cleaning liquid containing contaminants) flowing out of the upper surface of the quartz plate 451 to the outside of the first cleaning unit 4. The self-cleaning waste liquid sensor 454 measures the physical property value (water quality) of the waste liquid flowing in the self-cleaning liquid discharge pipe 453.

Specifically, the self-cleaning liquid discharge pipe 453 includes a waste liquid receiving portion 453a, a main pipe 453b, and branch pipes 453c and 453d branched from the main pipe 453b. The self-cleaning waste liquid sensor 454 is disposed between the branch pipes 453c and 453d.

The waste liquid receiving portion 453a has a bottom surface in which the main pipe 453b is connected to a discharge groove 453e on the lower surface, and sidewalls extending upward from the outer peripheral portions of the bottom surface. The pedestal 451a is disposed on the bottom surface. The bottom surface is preferably tilted so as to be lower at a portion closer to the main pipe 453b and facilitate the flow of the waste liquid into the main pipe 453b. Also, the sidewalls preferably extend to a position higher than the quartz plate 451 so that the waste liquid does not scatter.

The main pipe 453b extends vertically downward from the waste liquid receiving portion 453a, and bends at a lower position to extend in a horizontal direction. The branch pipe 453c branches from an upstream portion (a portion extending in the horizontal direction) of the main pipe 453b, and is connected to the liquid inlet of the self-cleaning waste liquid sensor 454. Meanwhile, the branch pipe 453d branches from a downstream portion of the main pipe 453b, and is connected to the liquid outlet of the self-cleaning waste liquid sensor 454.

When the waste liquid flows in the main pipe 453b, at least part of the waste liquid flows into the branch pipe 453c, and further flows into the self-cleaning waste liquid sensor 454. The waste liquid having its physical property value measured by the self-cleaning waste liquid sensor 454 joins the main pipe 453b via the branch pipe 453d.

Figure 4:
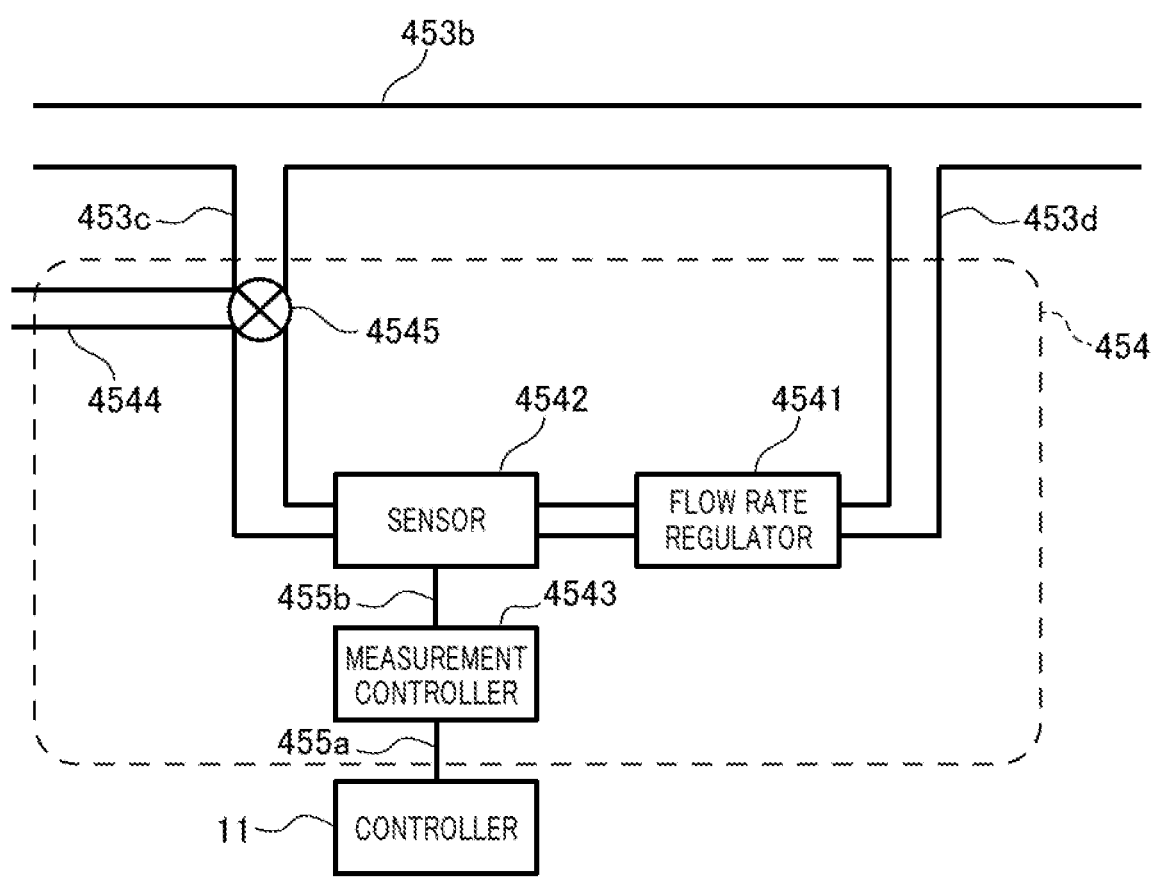
FIG. 4 is a schematic diagram showing the configuration of a self-cleaning waste liquid sensor.

FIG. 4 is a schematic diagram showing the configuration of the self-cleaning waste liquid sensor 454. The self-cleaning waste liquid sensor 454 includes a flow rate regulator 4541, a sensor 4542, a measurement controller 4543, a flushing water supply pipe 4544, and a three-way valve 4545. The controller 11 and the measurement controller 4543 are connected via a communication cable 455a, and the measurement controller 4543 and the sensor 4542 are connected via a measurement control cable 455b.

The flow rate regulator 4541 adjusts the amount of waste liquid flowing from the branch pipe 453c to the sensor 4542. As an example, the flow rate regulator 4541 includes a flow rate measurement sensor, a valve, and a controller having a CLC function for receiving a signal from the flow rate measurement sensor and adjusting the opening degree of the valve. The flow rate regulator 4541 also serves as a bellows pump (a pump that alternately performs suction and extrusion), and the waste liquid from the sensor 4542 is returned to the main pipe 453b via the branch pipe 453d.

The sensor 4542 measures the physical property value of the waste liquid flowing in from the branch pipe 453c. From the measured physical property value, the sensor 4542 may quantify the degree of contamination (the contamination amount) of the waste liquid at a predetermined time corresponding to the time of the measurement. Specific examples of physical property values will be described later.

The measurement controller 4543 controls the measurement conditions in the sensor 4542 via the measurement control cable 455b, and outputs the physical property value measured by the sensor 4542 and the measurement time thereof as logging data to the controller 11 via the communication cable 455a. The output signal may include a notification of completion of measurement operation preparation (contact), a sensor abnormality alarm such as an alarm of liquid leakage, or the like. Also, a signal indicating the start and stop of the measurement operation are inputted to the measurement controller 4543 from the controller 11 via the communication cable 455a.

The controller 11 determines the degree of contamination (the contamination amount) of the cleaning member 42a, on the basis of the measured physical property value. Here, the degree of contamination means how much the measured physical property value deviates from the target value (the ideal value) set in advance by the user. As a specific example, in a case where the physical property value is within a predetermined normal range, the controller 11 may determine that the degree of contamination of the cleaning member 42a is within the allowable range. In a case where the physical property value is not within the predetermined normal range, the controller 11 may determine that the degree of contamination of the cleaning member 42a is not within the allowable range.

Because the normal range also depends on the process type (such as Cu or STI) and the design rules of semiconductor elements, a set is empirically created to set the normal range.

Further, the controller 11 estimates the cleaning quality of the substrate W by adopting a predetermined cleaning quality estimation algorithm, on the basis of the measured physical property value. As for a specific example of the cleaning quality, the controller 11 may estimate what kind of defect (the number and the size of defects, the location of each defect, and the component (abrasive grains, an organic material, a residual chemical liquid, or the like) of each defect (contamination), for example) has occurred in the substrate W due to the cleaning of the substrate W using the cleaning member 42*a*. In the description below, the cleaning quality is represented by the number of fine particles (defects) adhering to the substrate W, for example.

The cleaning quality estimation algorithm may store the correlations between the defects that have occurred in the past (which can be measured by a defect inspection device) and the physical property values in a database in advance, and use the database in estimating a defect from the physical property value. Alternatively, the cleaning quality estimation algorithm may perform machine learning of the correlations between the defects that have occurred in the past and the physical property values in advance, and estimate a defect, the size of the defect, the location of the defect, and the component (abrasive grains, an organic substance, a residual chemical liquid, or the like) of the defect (contamination) from the physical property value, using artificial intelligence.

In a simple example, when the measured physical property value is within the predetermined normal range, the controller 11 determines that the cleaning quality is good (specifically, the number of defects on the surface of the substrate after the cleaning treatment is small). If the measured physical property value is not within the predetermined normal range, the controller 11 determines that the cleaning quality is not good. Alternatively, the controller 11 may estimate the number of defects that will occur in the cleaned substrate, in accordance with how much the measured physical property value deviates from the predetermined normal range.

The controller 11 may also determine the operating conditions when performing self-cleaning on the cleaning member 42*a* by adopting a predetermined self-cleaning operating condition determination algorithm, on the basis of the measured physical property value. The operating conditions include the pressing load and the rotational speed of the cleaning roller 42, the pressing load and the rotational speed of a cleaning tool 52, the flow rate and the temperature of the cleaning liquid to be supplied from the self-cleaning liquid nozzle 452, choice of water or a chemical liquid, and the set time of self-cleaning, for example.

The self-cleaning operating condition determination algorithm may store the correlations between physical property values and appropriate operating conditions in a database in advance, and use the database in estimating appropriate operating conditions in accordance with the physical property value. Alternatively, the self-cleaning operating condition determination algorithm may perform machine-learning of the correlations between physical property values and appropriate operating conditions in advance, and use artificial intelligence in estimating appropriate operating conditions in accordance with the physical property value.

The controller 11 may also determine the operating conditions when performing substrate cleaning by adopting a predetermined substrate-cleaning operating condition determination algorithm, on the basis of the measured physical property value. The operating conditions include the pressing load and the rotational speed of the cleaning roller 42, the pressing load and the rotational speed of the cleaning tool 52, the rotational speed of the spin chuck 41, the flow rate and the temperature of the cleaning liquid to be supplied from the cleaning liquid nozzle 43, choice of water or a chemical liquid, the scrub-cleaning time, the chemical rinsing time, and the water rinsing time, for example.

The substrate-cleaning operating condition determination algorithm may store the correlations between physical property values and appropriate operating conditions in a database in advance, and use the database in estimating appropriate operating conditions in accordance with the physical property value. Alternatively, the substrate-cleaning operating condition determination algorithm may perform machine-learning of the correlations between physical property values and appropriate operating conditions in advance, and use artificial intelligence in estimating appropriate operating conditions in accordance with the physical property value.

The controller 11 may also determine the timing to replace the cleaning member 42*a* by adopting a predetermined replacement time determination algorithm, on the basis of the measured physical property value.

The replacement time determination algorithm may store the correlations between physical property values and replacement timings in a database in advance, and use the database in estimating the replacement timing in accordance with the physical property value. Alternatively, the replacement time determination algorithm may perform machine learning of the correlations between physical property values and replacement timings in advance, and use artificial intelligence in estimating the replacement timing in accordance with the physical property value.

Examples of the physical property value to be measured by the sensor 4542 is now described.

The sensor 4542 may include a liquid-borne particle counter, and the physical property value may indicate the number of fine particles in the waste liquid. In a case where little polishing waste remains in the cleaning member 42*a* (which is a case where the degree of contamination of the cleaning member 42*a* is low), the number of fine particles measured by the liquid-borne particle counter is small. In a case where a large amount of polishing waste remains in the cleaning member 42*a* (which is a case where the degree of contamination of the cleaning member 42*a* is high), on the other hand, the number of fine particles measured by the liquid-borne particle counter is large. Accordingly, the degree of contamination of the cleaning member 42*a* can be determined on the basis of the number of fine particles in the waste liquid.

Also, the sensor 4542 may include a pH meter, and the physical property value may indicate the pH value of the waste liquid. The suspension to be used for polishing may be alkaline. In a case where only a small amount of the suspension remains in the cleaning member 42*a* (which is a case where the degree of contamination of the cleaning member 42*a* is low), the pH value measured by the pH meter is only slightly higher than 7. In a case where only a large amount of the suspension remains in the cleaning member 42*a* (which is a case where the degree of contamination of the cleaning member 42*a* is high), on the other hand, the pH value measured by the pH meter is higher than 7 by a predetermined amount. Accordingly, the degree of contamination of the cleaning member 42*a* can be determined on the basis of the pH value of the waste liquid.

The same applies in a case where the cleaning agent to be used for cleaning the substrate is alkaline. That is, in a case where only a small amount of the cleaning liquid remains in the cleaning member 42*a*, the pH value measured by the pH meter is close to 7. In a case where a large amount of the cleaning liquid remains, the pH value measured by the pH meter is higher.

Also, the sensor 4542 may include a conductance meter, and the physical property value may indicate the electrical conductivity of the waste liquid. The suspension to be used for polishing contains ions (cations, or anions). In a case where only a small amount of the suspension remains in the cleaning member 42a (which is a case where the degree of contamination of the cleaning member 42a is low), the electrical conductivity indicates a low numerical value. In a case where a large amount of the suspension remains, on the other hand, the electrical conductivity indicates a high numerical value. The same applies when the cleaning liquid contains ions. Accordingly, the degree of contamination of the cleaning member 42a can be determined on the basis of the electrical conductivity of the waste liquid.

Also, the sensor 4542 may include a carbon concentration meter, and the physical property value may indicate the total organic carbon concentration of the waste liquid. The suspension to be used for polishing contains an organic compound (water-soluble polymer, corrosion inhibitor, or surfactant). In a case where only a small amount of the suspension remains in the cleaning member 42a (which is a case where the degree of contamination of the cleaning member 42a is low), the total organic carbon concentration indicates a low numerical value. In a case where a large amount of the suspension remains, on the other hand, the total organic carbon concentration indicates a high numerical value. The same applies when the cleaning liquid contains an organic compound. Accordingly, the degree of contamination of the cleaning member 42a can be determined on the basis of the total organic carbon concentration of the waste liquid.

Further, the physical property value may be another physical property value correlated with the degree of contamination of the cleaning member 42a, or may be a combination of two or more physical property values.

Meanwhile, when the waste liquid is steadily measured, contaminants in the waste liquid might accumulate on the sensor 4542 over time, resulting in an error in a measured value. To prevent such a measurement error, it is preferable to clean the sensor 4542 by supplying flushing water (pure water, for example) from the flushing water supply pipe 4544 through the valve (three-way valve) 4545 at regular time intervals.

For example, in a case where flushing is performed at the timing of replacement of the substrate cleaning member 42a, and the sensor 4542 senses the number of fine particles, the numbers of fine particles before and after flushing are as shown in FIG. 5A.

Figure 5B:
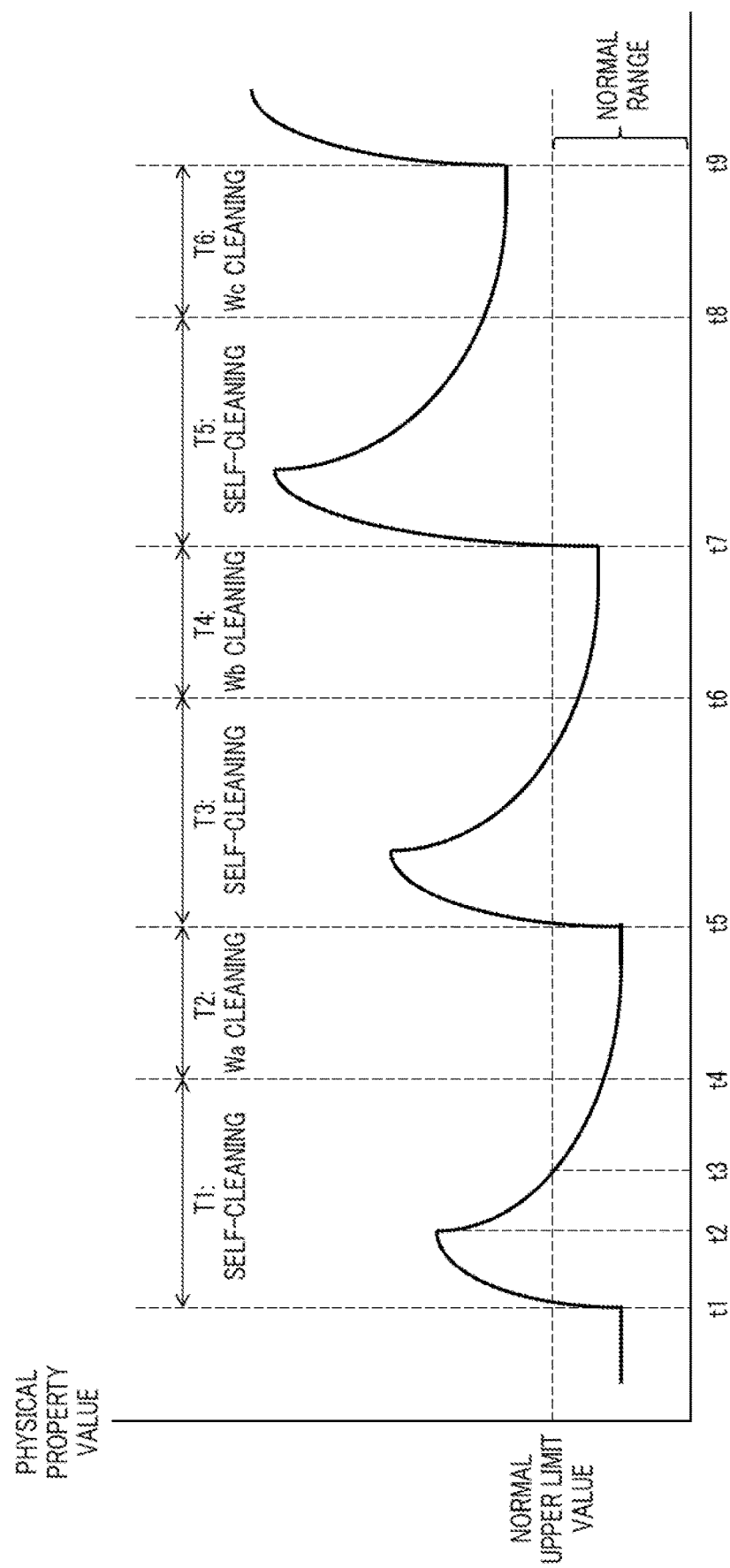
FIG. 5B is a graph schematically showing outputs of physical property values measured by the self-cleaning waste liquid sensor.

FIG. 5B is a graph schematically showing outputs of physical property values measured by the self-cleaning waste liquid sensor 454. FIG. 5B shows an example in which the sensor 4542 is KS-18F, which is a liquid-borne particle counter manufactured by RION Co., Ltd., the measurement controller 4543 is KE-40B1 manufactured by the company, and the flow rate regulator 4541 is K9904A, which is a bellows sampler manufactured by the company.

The abscissa axis in the graph indicates the time of measurement, and the ordinate axis indicates the number of fine particles in liquid per unit volume of the waste liquid (hereinafter referred to simply as the "number of fine particles"). The greater the value of the number of fine particles, the higher the degree of contamination of the waste liquid (the larger the amount of contamination).

In this embodiment, the cleaning roller 42 alternately performs scrub-cleaning on a substrate W and self-cleaning with the self-cleaning module 45. Specifically, self-cleaning is performed in periods T1, T3, and T5, and scrub-cleaning of substrates Wa, Wb, and Wc is performed in periods T2, T4, and T6, respectively. Each of the substrates Wa to Wc may be one substrate, or may include a plurality of substrates.

In the self-cleaning in the period T1, the contaminants adhering to the cleaning member 42a flow into the waste liquid immediately after the start of the self-cleaning in the period from time t1 to time t2. Therefore, the number of fine particles temporarily increases greatly, and exceeds the normal range.

However, after time t2, as the cleaning member 42a is cleaned with the lapse of time of self-cleaning, the number of fine particles in the waste liquid gradually decreases, and eventually reaches the normal range at time t3. At time t4, the self-cleaning is completed. Scrub-cleaning of the substrate Wa is then started while the number of fine particles is within the normal range. At this point of time, the controller 11 can grasp that the substrate Wa has been cleaned while the degree of contamination of the cleaning member 42a was within the allowable range, on the basis of the number of fine particles at time t4.

In the time period during which the substrate Wa is scrubbed from time t4 to time t5 (period T2), the contaminants from the cleaning member 42a are not brought into the self-cleaning module 45, and therefore, the number of fine particles converges to a constant value.

During the period from time t5 to time t6 (period T3), self-cleaning of the cleaning member 42a is performed as in the period T1. In the example in FIG. 5B, self-cleaning is also completed (time t6) while the number of fine particles is within the normal range in the period T3, and scrub-cleaning of the substrate Wb is performed in the period T4. At this point of time, the controller 11 can grasp that the substrate Wb has been cleaned while the degree of contamination of the cleaning member 42a was within the allowable range, on the basis of the number of fine particles at time t6.

During the period from time t7 to time t8 (period T5), self-cleaning of the cleaning member 42a is performed as in the period T1. However, in the example in FIG. 5B, the number of fine particles does not decrease to a value within the normal range during the period T5. This means that the degree of contamination of the cleaning member 42a is high and is not within the allowable range. Self-cleaning is then completed (time t9) while the number of fine particles is above the normal range, and cleaning of the substrate Wc is performed in the period T6. At this point of time, the controller 11 can grasp that the substrate Wc has been cleaned while the degree of contamination of the cleaning member 42a was not within the allowable range, on the basis of the number of fine particles at time t9.

Note that the completion of self-cleaning is based on the cleaning treatment recipe. That is, in a case where a certain period of time has elapsed since the start of self-cleaning, the self-cleaning is completed after a lapse of time in order to start the cleaning treatment for the next substrate.

As described above, the example in FIG. 5B shows that the number of fine particles did not reach the normal range during the self-cleaning (period T5) performed immediately before the cleaning of the substrate Wc (period T6). That is, the cleaning treatment for the substrate Wc is started, through the self-cleaning of the cleaning member 42a is insufficient, and a large amount of contaminants remain on the cleaning member 42a. Therefore, the risk of cross contamination of the substrate Wc is high. The controller 11 senses the state in which the cross contamination risk is high as an abnormality. The controller 11 then performs a control process such as alarm activation in accordance with the abnormal level, as necessary.

For example, in a case where the abnormal level is Level 1 (a slight abnormality, occurring in a single substrate), it may be reported that there is a possibility that the number of defects is larger than that in the other substrates.

In a case where the abnormal level is Level 2 (a slight abnormality, occurring continuously in two or more substrates), the controller 11 may be instructed to change the operating conditions for self-cleaning or substrate cleaning.

In a case where the abnormal level is Level 3 (a severe abnormality, occurring in a single substrate), an instruction may be issued to perform defect inspection, perform a re-cleaning treatment, or exclude the substrate as a defective product.

In a case where the abnormal level is Level 4 (a severe abnormality, occurring continuously in two or more substrates), the polishing/cleaning treatment in the substrate processing apparatus may be stopped, and the controller 11 may be further instructed to replace the cleaning member 42*a* with a new one.

FIG. 5B shows an example case where the physical property value indicates the number of fine particles, but the same behaviors will be observed in a case where the physical property value indicate the pH value, the electrical conductivity, or the total organic carbon concentration. In a case where the physical property value indicates the pH value, the pH value converges to almost 7 (neutral) in the period T2 or the like during which self-cleaning is not performed.

FIG. 6 is a flowchart showing an example processing operation to be performed by the controller 11. FIG. 6 is an operation sequence in a complete standby state (in a state where the cassette for accommodating a substrate is not placed in the load port 2 of the substrate processing apparatus, and any of polishing, cleaning, and drying of a substrate is not being performed in FIG. 1, or before time t1 in FIG. 5B). Although the controller 11 is included in the substrate processing apparatus, it can also be said that the first cleaning unit 4 includes the controller 11 that controls each component of the first cleaning unit 4.

The controller 11 causes the sensor 4542 of the self-cleaning waste liquid sensor 454 to start measurement of the physical property value of the waste liquid, with the cleaning roller 42 being set in the self-cleaning module 45. The output of the sensor 4542 is then outputted via the measurement controller 4543, and the controller 11 reads the output (step S1).

If the read physical property value is within the normal range (YES in step S2), the cleaning member 42*a* has been sufficiently cleaned, so that an appropriate cleaning treatment can be performed on the substrate. Accordingly, the controller 11 determines that the preparation for a substrate treatment including cleaning has been completed (step S3).

If the read physical property value is not within the normal range (NO in step S2), on the other hand, the contaminants deposited on the cleaning member 42*a* still remain, and the cleaning is insufficient. Therefore, the controller 11 makes a further determination on the basis of the state of self-cleaning.

Specifically, if the duration time from the start of self-cleaning is shorter than a predetermined upper limit time (YES in step S4), the controller 11 continues the self-cleaning of the cleaning member 42*a* (step S5), and returns to the physical property value reading process (step S1). The controller 11 grasps the cleaning duration time for the cleaning member 42*a*. Further, the duration time from the start of the self-cleaning is the total cleaning time (accumulated time) since the replacement with the new cleaning member 42*a*, and is not reset even if the task of the self-cleaning ends once (that is, when the cleaning member is replaced with a new cleaning member 42*a*, the duration time is reset).

If the duration time from the start of the self-cleaning exceeds the predetermined upper limit time (NO in step S4), on the other hand, there is a high possibility that the cleanliness of the cleaning member 42*a* will not increase even if the self-cleaning is further continued. Therefore, the controller 11 stops the self-cleaning, and determines that the cleaning roller 42 needs to be replaced with a new one (step S6). In a specific example, the controller 11 outputs a message or an alert indicating that the cleaning roller 42 should be replaced with a new one, and issues an instruction to replace it with a new cleaning roller 42.

The above series of processes is continued until the physical property value reaches the normal range.

FIG. 7 is a flowchart showing another example processing operation to be performed by the controller 11. FIG. 7 is an operation sequence in a processing state (a state where the cassette holding a substrate is placed in the load port 2 of the substrate processing apparatus, and a substrate is present in one of the polishing units 3*a* to 3*d*, the first cleaning unit 4, the second cleaning unit 5, the drying unit 6, the substrate conveying robots 7, 9, and 10, and the substrate conveying unit 8 in FIG. 1).

The controller 11 causes the sensor 4542 of the self-cleaning waste liquid sensor 454 to start measurement of the physical property value of the waste liquid, with the cleaning roller 42 being set in the self-cleaning module 45, as in the above-described complete standby state (FIG. 6). The output of the sensor 4542 is then outputted via the measurement controller 4543, and the controller 11 reads the output (step S11).

If the read physical property value is within the normal range (YES in step S12), the controller 11 estimates the quality of the substrate cleaning, on the basis of a database indicating the correlations between physical property values and defects (step S13). In a specific example, the controller 11 estimates the number of defects in the substrate after the treatment.

If the read physical property value is not within the normal range (NO in step S12), on the other hand, the contaminants deposited on the cleaning member 42*a* still remain, and the cleaning is insufficient. Therefore, the controller 11 makes a further determination on the basis of the operating status of the cleaning member 42*a*.

Specifically, if the cleaning member 42*a* is in contact with the upper surface of the substrate (YES in step S14), or, in other words, if the cleaning member 42*a* is at the cleaning position and is performing substrate cleaning (one of the periods T2, T4, and T6 in FIG. 5B, for example), the controller 11 determines that the risk of cross contamination from the cleaning member 42*a* to the substrate is high, and outputs a warning of a process abnormality of the substrate (step S15). Further, the controller 11 estimates the quality of the substrate cleaning, on the basis of the database indicating the correlations between physical property values and defects (step S13).

If the cleaning member 42*a* is not in contact with the upper surface of the substrate (NO in step S14), or, in other words, if the cleaning member 42*a* is at the retreat position and is performing self-cleaning (one of the periods T1, T3, and T5 in FIG. 5B, for example), the controller 11 determines that the risk of cross contamination is none, and continues the self-cleaning of the cleaning member 42a and the reading of the physical property value (step S11).

Since the controller 11 controls the first cleaning unit 4, the controller 11 can recognize whether the cleaning member 42a is at the cleaning position or at the retreat position in step S14.

The series of processes described above is performed on all supplied substrates.

As described above, according to this embodiment, the physical property value of the waste liquid at a time of self-cleaning of the cleaning member 42a is measured. Therefore, the degree of contamination of the cleaning member 42a can be monitored in line on the basis of the physical property value.

Also, the quality of substrate cleaning can be estimated on the basis of the physical property value (or the degree of contamination of the cleaning member 42a).

Note that the self-cleaning module 45 in the first cleaning unit 4 in FIG. 1 monitors the degree of contamination of the roll-type cleaning member 42a, and estimates the quality of substrate cleaning. Meanwhile, the same operation can be performed on the second cleaning unit 5 or a cleaning member that is not of a roll type. In the description below, the second cleaning unit 5 uses a pencil-type cleaning member.

Figure 8:
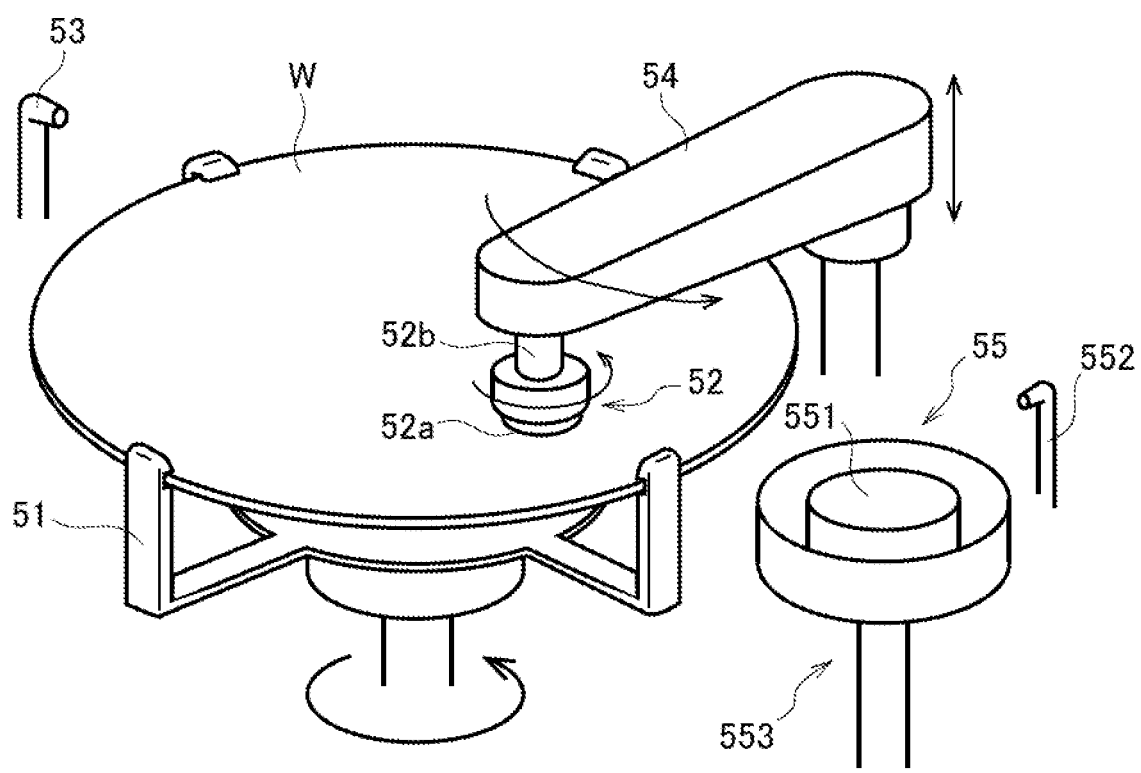
FIG. 8 is a perspective diagram showing an entire second cleaning unit.

FIG. 8 is a perspective diagram showing the entire second cleaning unit 5. The second cleaning unit 5 includes a spin chuck 51 (a substrate holder), a cleaning tool 52, a cleaning liquid nozzle 53, a swing arm 54, and a self-cleaning module 55.

The spin chuck 51 horizontally holds and horizontally rotates a substrate W at a predetermined rotational speed so that its principal surface faces upward (or turns out to be the upper surface).

The cleaning tool 52 has a pencil-type cleaning member 52a (a substrate cleaning member) attached to its end, and rotates the cleaning member 52a. The material of the cleaning member 52a is PVA sponge or the like.

The cleaning liquid nozzle 53 supplies a cleaning liquid to the upper surface of the substrate W held by the spin chuck 51. The cleaning liquid is a chemical liquid or pure water, for example.

The swing arm 54 has the cleaning tool 52 attached to its end via a support shaft 52b, and swings and lifts up/down the cleaning tool 52. Specifically, the self-cleaning module 55 is disposed on the swing trajectory to be drawn by the cleaning tool 52 when the swing arm 54 swings. As the swing arm 54 swings, the cleaning member 52a moves between the position (a cleaning position) at which the spin chuck 51 is disposed and the position (a cleaning position) at which the self-cleaning module 55 is disposed. Also, as the swing arm 54 moves up and down at the cleaning position, the cleaning member 52a comes into contact with or separates from the substrate W. Further, as the swing arm 54 moves up and down at the retreat position, the cleaning member 52a comes into contact with or separates from a quartz plate 551 (described later) of the self-cleaning module 55.

The second cleaning unit 5 having such a configuration operates as follows, under the control of the controller 11. Before the substrate cleaning is performed, the cleaning member 52a stands by at the retreat position.

First, the substrate subjected to the primary cleaning by the first cleaning unit 4 shown in FIG. 1 is conveyed onto the spin chuck 51 by the second substrate conveying robot 9. Contaminants adhere to this substrate. The substrate W conveyed onto the spin chuck 51 is rotated at a predetermined rotational speed by the spin chuck 51, and the cleaning liquid is supplied from the cleaning liquid nozzle 53 toward the vicinity of the center of the substrate W.

The swing arm 54 then moves upward to remove the cleaning tool 52 out of the self-cleaning module 55, and swings toward the cleaning position side to move the cleaning tool 52 to a position above the center of the substrate W. When the cleaning tool 52 is moved from the self-cleaning module 55 to the cleaning position, the cleaning tool 52 is preferably not rotating.

The swing arm 54 next moves downward, to bring the lower surface of the cleaning member 52a into contact with the upper surface of the substrate W. The cleaning tool 52 starts rotating about the support shaft 52b at a predetermined rotational speed immediately before coming into contact with the substrate W. In a state where the cleaning member 52a is in contact with the upper surface of the substrate W and is rotating, the swing arm 54 presses the cleaning member 52a against the substrate W with a predetermined pressure, and swings the cleaning member 52a between the outer peripheral portion and the center of the substrate W at a predetermined velocity.

As the cleaning member 52a relatively moves while being in sliding contact with the upper surface of the substrate W as described above, scrub-cleaning is performed. By this scrub-cleaning, the contaminants adhering to the upper surface of the substrate W are removed. Part of the contaminants removed from the upper surface of the substrate W remains on the cleaning member 52a. Also, the cleaning liquid contaminated when used for cleaning the substrate might remain on the cleaning member 52a as a contaminant. After a predetermined time has passed, the swing arm 54 stops and then moves upward, to separate the cleaning member 52a from the substrate W. The scrub-cleaning then comes to an end.

After the cleaning of one substrate is completed, the supply of the cleaning liquid from the cleaning liquid nozzle 53 is stopped, and the swing arm 54 swings so that the cleaning tool 52 moves to the self-cleaning module 55. The swing arm 54 then moves downward, and the self-cleaning module 55 performs self-cleaning on the cleaning member 52a as described later, to remove the contaminants remaining on the cleaning member 52a.

Figure 9:
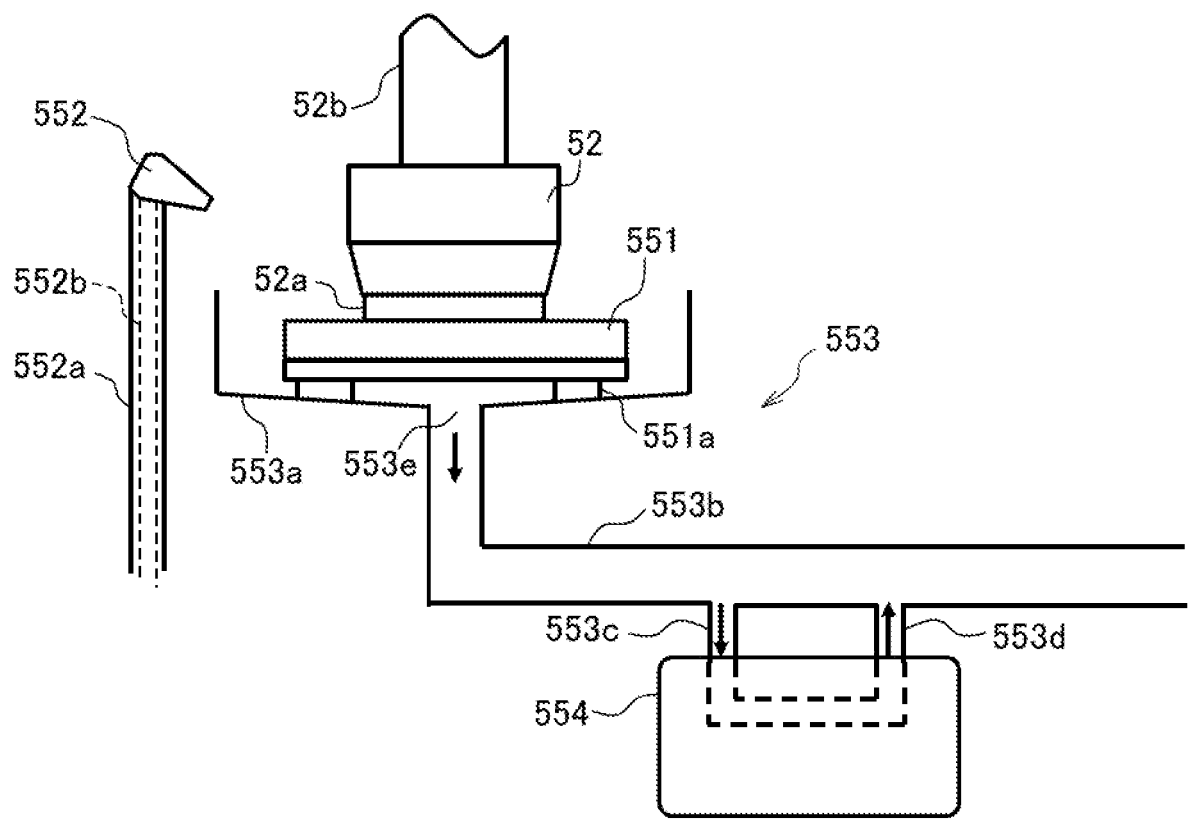
FIG. 9 is a perspective diagram showing the configuration of a self-cleaning module in the second cleaning unit.

FIG. 9 is a perspective diagram showing the configuration of the self-cleaning module 55 in the second cleaning unit 5. The self-cleaning module 55 includes the quartz plate 551 (a self-cleaning member) supported by a pedestal 551a, and a self-cleaning liquid nozzle 552 that supplies a cleaning liquid (a chemical liquid or pure water, for example) to the upper surface of the quartz plate 551.

The self-cleaning member may be a resin plate formed with polytetrafluoroethylene (PTFE), polyvinylidene difluoride (PVDF), polyethylene terephthalate (PET), polymethyl methacrylate (PMMA), polycarbonate (PC), or the like, instead of a quartz plate. However, it is desirable to use a material that has such hardness as to make the surface less likely to be scratched, resistance to deformation, and chemical stability (with no possibility of elution of metal or organic substance, and little likelihood of thermal degradation).

The self-cleaning liquid nozzle 552 includes a cylindrical nozzle support 552a, and a conduit 552b buried inside the nozzle support 552a.

As described above, when the cleaning of one substrate is completed, the cleaning tool 52 is moved to the self-cleaning module 55 by the swing arm 54 (FIG. 8). The cleaning tool 52 then descends while rotating through an operation of the swing arm 54. As the cleaning member 52a comes into sliding contact with the upper surface of the quartz plate 551, self-cleaning of the cleaning member 52a is performed with the cleaning liquid from the self-cleaning liquid nozzle 552. By this self-cleaning, the contaminants remaining on the cleaning member 52a are removed, and are discharged together with the cleaning liquid. After a predetermined time has passed, the swing arm 54 moves upward, and the cleaning member 52a is separated from the quartz plate 551. The self-cleaning then comes to an end.

The self-cleaning module 55 also includes a self-cleaning liquid discharge pipe 553 and a self-cleaning waste liquid sensor 554. The self-cleaning liquid discharge pipe 553 includes a waste liquid receiving portion 553a having a discharge groove 553e formed in its lower surface, a main pipe 553b, and branch pipes 553c and 553d branched from the main pipe 553b. These are the same as those shown in FIGS. 3 and 4, and therefore, detailed explanation of them is not made herein.

A processing operation as described above with reference to FIG. 6 or 7 is also performed on the second cleaning unit 5 by the controller 11. The configuration of the second cleaning unit 5 may be the same as the configuration of the first cleaning unit 4.

Each of the embodiments described above can also be applied to break-in processing (the conditioning before starting to use a new substrate cleaning member). Conventionally, a new dummy substrate is cleaned after break-in, and the number of contaminating particles adhering to the dummy substrate is measured to determine whether the break-in has been appropriately performed. However, according to each of the embodiments described above, it is possible to determine whether the break-in is appropriate without the use of a new dummy substrate.

Specifically, the quartz plate 451 or 551 is brought into sliding contact with the cleaning member 42a or 52a before the substrate cleaning, and the break-in processing of the cleaning member 42a or 52a is performed using the cleaning liquid supplied from the self-cleaning liquid nozzle 452 or 552. The sensor 4542 then measures the physical property value of the waste liquid of the cleaning liquid used for the break-in processing. Further, the controller 11 determines whether the break-in processing is appropriate on the basis of the physical property value of the waste liquid. By an example determination method, when the physical property value of the waste liquid is within a preset normal range, the break-in processing can be determined to be appropriate. When the physical property value is above the normal range, the break-in processing can be determined not to be appropriate. The physical property value may be the number of fine particles, the pH value, the electrical conductivity, the total organic carbon concentration, or the like. It can be considered that the self-cleaning module 45 or 55 and the controller 11 constitute a break-in device.

The above embodiments are disclosed for enabling those with ordinary knowledge in the technical field of the present invention to carry out the present invention. Various modifications of the above embodiments should be obvious to those skilled in the art, and the technical ideas of the present invention can be applied to other embodiments. Therefore, the present invention is not limited to the above embodiments, and should be construed as including a wider technical scope based on the technical ideas defined by the claims.

REFERENCE SIGNS LIST

1 Housing
2 Load port
3a to 3d Polishing unit
4 First cleaning unit
41 Spin chuck
41a Spindle
41b Top
42 Cleaning roller
42a Cleaning member
43 Cleaning liquid nozzle
44 Support column
45 Self-cleaning module
451 Quartz plate
451a Pedestal
452 Self-cleaning liquid nozzle
452a Nozzle support
452b Conduit
453 Self-cleaning liquid discharge pipe
453a Waste liquid receiving portion
453b Main pipe
453c, 453d Branch pipe
453e Discharge groove
454 Self-cleaning waste liquid sensor
4541 Flow rate regulator
4542 Sensor
4543 Measurement controller
4544 Flushing water supply pipe
4545 Three-way valve
455a Communication cable
455b Measurement control cable
5 Second cleaning unit
51 Spin chuck
52 Cleaning tool
52a Cleaning member
52b Support shaft
53 Cleaning liquid nozzle
54 Swing arm
55 Self-cleaning module
551 Quartz plate
552 Self-cleaning liquid nozzle
553 Self-cleaning liquid discharge pipe
553a Waste liquid receiving portion
553b Main pipe
553c, 553d Branch pipe
554 Self-cleaning waste liquid sensor
6 Drying unit
7 First substrate conveying robot
8 Substrate conveying unit
9 Second substrate conveying robot
10 Third substrate conveying robot
11 Controller

What is claimed is:
1. A substrate cleaning device comprising:
a substrate holder configured to hold a substrate;
a substrate cleaning member configured to come into sliding contact with the held substrate, and clean the substrate using a first cleaning liquid supplied from a first nozzle;
a self-cleaning member configured to come into sliding contact with the substrate cleaning member at a retreat position separated from the substrate holder, and perform self-cleaning on the substrate cleaning member using a second cleaning liquid supplied from a second nozzle;
a measurement module configured to measure a physical property value of a waste liquid of the second cleaning liquid used for the self-cleaning of the substrate cleaning member; and a controller configured to estimate a number of fine particles adhering to the cleaned substrate based on the physical property value of the waste liquid;

a first pipe configured to guide the waste liquid of the second cleaning liquid used for the self-cleaning of the substrate cleaning member to the measurement module;

a three-way valve provided in the first pipe; and a second pipe configured to supply flushing water to the measurement module via the three-way valve.

2. The substrate cleaning device according to claim 1, wherein the physical property value includes at least one of a number of fine particles, a pH value, an electrical conductivity, and a total organic carbon concentration.

3. The substrate cleaning device according to claim 1, wherein the controller determines an operating condition for self-cleaning based on the physical property value of the waste liquid.

4. The substrate cleaning device according to claim 1, wherein the controller determines an operating condition for substrate cleaning based on the physical property value of the waste liquid.

5. The substrate cleaning device according to claim 1, wherein the controller determines a timing to replace the substrate cleaning member based on the physical property value of the waste liquid.

6. A substrate processing apparatus comprising:

a substrate polishing device that polishes a substrate, using a suspension; and the substrate cleaning device according claim 1.

* * * * *